United States Patent
Shen (10) Patent No.: US 7,215,017 B2
(45) Date of Patent: May 8, 2007

(54) WAFER LEVEL PACKAGE, WAFER LEVEL PACKAGING PROCEDURE FOR MAKING WAFER LEVEL PACKAGE

(76) Inventor: Yu-Nung Shen, No. 60, Lane 328, Li-Shan Street, Nei-Hu Dist., Taipei City (TW)

( * ) Notice: Subject to any disclaimer, the term of this patent is extended or adjusted under 35 U.S.C. 154(b) by 191 days.

(21) Appl. No.: 10/833,149

(22) Filed: Apr. 28, 2004

(65) Prior Publication Data

US 2004/0217473 A1    Nov. 4, 2004

(30) Foreign Application Priority Data

May 2, 2003    (TW) ............................... 92112161 A (51) Int. Cl.
*H01L 23/02* (2006.01)
*H01L 23/48* (2006.01)

(52) U.S. Cl. ...................... 257/686; 257/778
(58) Field of Classification Search ................ 257/686, 257/777, 787, 784, 778, 698
See application file for complete search history.

(56) References Cited

U.S. PATENT DOCUMENTS

2004/0191955 A1* 9/2004 Joshi et al. ................. 438/106

FOREIGN PATENT DOCUMENTS

KR    2001-0009564   *  2/2001
TW         434848        5/2001

* cited by examiner

*Primary Examiner*—Howard Weiss
*Assistant Examiner*—(Vikki) Hoa B. Trinh
(74) *Attorney, Agent, or Firm*—Rosenberg, Klein & Lee (57) ABSTRACT

A wafer level packaging procedure provides a wafer having a pad mounting surface with bonding pads on the pad mounting surface. An insulative layer is formed with conductor formation holes exposing the bonding pads. Conductors are formed in the respective conductor formation holes. A photoresist protective layer is formed on the pad mounting surface and then holes are formed in the photoresist protective layer for exposing parts of the respective conductors. Conductive bumps are formed in the holes in the photoresist protective layer in electric connection to the respective conductors.

11 Claims, 6 Drawing Sheets

WAFER LEVEL PACKAGE, WAFER LEVEL PACKAGING PROCEDURE FOR MAKING WAFER LEVEL PACKAGE

BACKGROUND OF THE INVENTION

1. Field of the Invention

The present invention relates to a wafer level packaging procedure for making wafer level packages. The invention relates also to a semiconductor package made by means of the application of the wafer level packaging procedure.

2. Background of the Invention

A conventional wafer level packaging technique applies electric conducting pastes to the surface of every die zone of the wafer to be packaged, to form conductors that extend from every bonding pad to a predetermined location. Taiwan Patent No. 434848, issued to the present inventor, teaches a similar design. During formation of conductors with electric conducting pastes, the electric conducting pastes are applied to the wafer with a steel plate by printing. The steel plate has a plurality of through holes corresponding to the bonding pads at the wafer. During printing, the steel plate is put on the surface of the wafer, and then the electric conducting pastes are applied to the through holes of the steel plate by means of a printing head. When hardened, the printed electric conducting pastes form the desired conductors subject to the predetermined shapes.

Following improvement of semiconductor manufacturing process, the count of die zones on a wafer is relatively increased, and the area of the die zone on the wafer is relatively reduced. In consequence, the number of bonding pads at the wafer is relatively increased, i.e., the pitch between two adjacent bonding pads is greatly reduced. However, the hole width of the through holes on a steel plate for the aforesaid electric conducting pastes printing process cannot be smaller than 25 mm due to technical limitations. According to conventional techniques, a steel plate cannot be used to print electric conducting pastes on a wafer to make conductors thinner than 25 mm.

SUMMARY OF INVENTION

The present invention has been accomplished under the circumstances in view. It is therefore the main object of the present invention to provide a wafer level packaging procedure, which eliminates the aforesaid problem.

A wafer level packaging procedure according to the first embodiment of the present invention comprises the steps of a) providing a semiconductor wafer that includes a plurality of die zones, a pad mounting surface, and a plurality of bonding pads disposed to the pad mounting surface; b) covering a whole area of the pad mounting surface with a photoresist to form an insulative layer, and then employing photo masking and chemical rinsing processes to form conductor formation holes in the insulative layer corresponding to the bonding pads, each of the conductor formation holes exposing a part of a respective one of the bonding pads and a part of the pad mounting surface adjacent to the respective one of the bonding pads; c) applying electric conducting pastes to the insulative layer to fill up the conductor formation holes, so as to form a plurality of conductors that extend from the respective bonding pads to the adjacent pad mounting surface of the wafer; d) employing a grinding process to remove the electric conducting pastes from the insulative layer, leaving the conductors of the electric conducting pastes in the conductor formation holes and separated from one another by the insulative layer; e) forming a photoresist protective layer on the insulative layer, and then employing photo masking and chemical rinsing processes to the photoresist protective layer to make holes in the photoresist protective layer for exposing parts of the respective conductors in the conductor formation holes; and f) forming conductive bumps in the respective holes in the photoresist protective layer in electric connection to the respective conductors in the conductor formation holes and keeping a part of each of the conductive bumps protruding over the photoresist protective layer.

A wafer level packaging procedure according to the second embodiment of the present invention comprises the steps of: a) providing a semiconductor wafer that includes a plurality of die zones, a pad mounting surface, and a plurality of bonding pads disposed on the pad mounting surface; b) covering a whole area of the pad mounting surface with a photoresist to form an insulative layer, and then employing photo masking and chemical rinsing processes to form conductor formation holes in the insulative layer corresponding to the bonding pads, each of the conductor formation holes exposing a part of a respective one of the bonding pads and a part of the pad mounting surface adjacent to the respective one of the bonding pads; c) applying electric conducting pastes to the insulative layer to fill up the conductor formation holes, so as to form a plurality of conductors that extend from the respective bonding pads to the adjacent pad mounting surface of the wafer; d) employing a grinding process to remove the electric conducting pastes from the insulative layer, leaving the conductors of the electric conducting pastes in the conductor formation holes and separated from one another by the insulative layer; e) removing the insulative layer; f) forming a photoresist protective layer on the pad mounting surface to cover the conductors, and then employing photo masking and chemical rinsing processes to the photoresist protective layer to make holes in the photoresist protective layer for exposing parts of the respective conductors; and g) forming conductive bumps in the respective holes in the photoresist protective layer in electric connection to the respective conductors and leaving a part of each of the conductive bumps protruding over the photoresist protective layer.

A wafer level packaging procedure according to the third embodiment of the present invention comprises the steps of: a) providing a semiconductor wafer that includes a plurality of die zones, a pad mounting surface, and a plurality of bonding pads disposed on the pad mounting surface; b) covering a whole area of the pad mounting surface with a photoresist to form an insulative layer, and then employing photo masking and chemical rinsing processes to form first conductor formation holes in the insulative layer corresponding to the bonding pads, each of the conductor formation holes exposing a part of a respective one of the bonding pads and a part of the pad mounting surface adjacent to the respective one of the bonding pads; c) applying electric conducting pastes to the insulative layer to fill up the conductor formation holes, so as to form a plurality of conductors that extend from the respective bonding pads to the adjacent pad mounting surface of the wafer; d) employing a grinding process to remove the electric conducting pastes from the insulative layer, leaving the conductors of the electric conducting pastes in the conductor formation holes and separated from one another by the insulative layer; e) using a photoresist to form a first cover layer on the insulative layer covering the conductors, and then employing photo masking and chemical rinsing processes to the first cover layer to make second conductor formation holes in the first cover layer for exposing the respective conductors; f) using a photoresist to form a second cover layer on the first cover layer, and then employing photo masking and chemical rinsing processes to the second cover layer to make third conductor formation holes in the second cover layer corresponding to the second conductor formation holes, each of the third conductor formation holes having a diameter greater than that of each of the second conductor formation holes; g) forming a layer of electric conducting pastes on the second cover layer to fill up the second conductor formation holes and the third conductor formation holes in electric connection to the conductors; h) employing a grinding process to remove the layer of electric conducting pastes from the second cover layer; and i) forming conductive bumps on the electric conducting pastes filled in the third conductor formation holes.

A wafer level package according to the first embodiment of the present invention comprises a semiconductor wafer including a plurality of die zones, a pad mounting surface, and a plurality of bonding pads disposed on the pad mounting surface. An insulative layer is formed over the pad mounting surface, the insulative layer has a plurality of first conductor formation holes therein, each of the first conductor formation holes exposing a part of a respective one of bonding pads and a part of the pad mounting surface adjacent to the respective one of the bonding pads. A plurality of conductors are formed from electric conducting pastes in the respective first conductor formation holes and respectively extend from the respective bounding pads to the adjacent pad mounting surface of the wafer. A first cover layer covers the insulative layer; the first cover layer has therein a plurality of second conductor formation holes for exposing parts of the respective conductors. A second cover layer covers the first cover layer. The second cover layer has therein a plurality of third conductor formation holes respectively axially aligned with the second conductor formation holes in the first cover layer, and each of the third conductor formation holes have a diameter greater than that of each of the second conductor formation holes. Electric conducting pastes are filled in the third conductor formation holes and the second conductor formation holes in electric connection to the respective conductors; and a plurality of conductive bumps are formed on the electric conducting pastes filled in the respective third conductor formation holes.

A wafer level package according to the second embodiment of the present invention comprises a semiconductor wafer including a plurality of die zones, a pad mounting surface, and a plurality of bonding pads disposed on the pad mounting surface. An insulative layer is formed over the pad mounting surface. The insulative has therein a plurality of conductor formation holes; each of the conductor formation holes exposing a part of a respective one of the bonding pads and a part of the pad mounting surface adjacent to the respective one of bonding pads. A plurality of conductors are formed from electric conducting pastes in the respective conductor formation holes and respectively extend from the respective bonding pads to the adjacent pad mounting surface of the wafer. A protective layer is formed on the insulative layer; the protective layer has therein a plurality of holes for exposing parts of the respective conductors. A plurality of conductive bumps are formed on the respective conductors and partially protrude over the protective layer.

A wafer level package according to the third embodiment of the present invention comprises a semiconductor wafer comprising a plurality of die zones, a pad mounting surface, and a plurality of bonding pads disposed on the pad mounting surface. A plurality of conductors are formed from electric conducting pastes on the respective bonding pads and extend from the respective bonding pads to the pad mounting surface of the wafer. A protective layer is formed on the pad mounting surface, the protective layer has therein a plurality of holes for exposing parts of the respective conductors. A plurality of conductive bumps is formed in the respective holes of the protective layer. The conductive bumps are connected electrically to the respective conductors and partially protrudes over the protective layer.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF THE EMBODIMENTS

Figure 1:
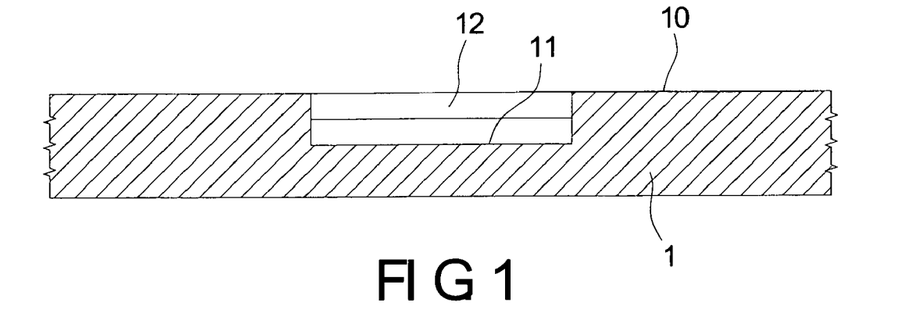
FIGS. 1–8 are schematic, cross-sectional views, showing a semiconductor wafer level package manufacturing flow according to the first embodiment of the present invention.

Referring to FIG. 1, a semiconductor wafer 1 having die zones is provided (FIG. 1 shows only a part of one die zone of the semiconductor wafer). The semiconductor wafer 1 comprises a pad mounting surface 10, a plurality of bonding pads 11 (only one bonding pad is shown in FIG. 1) disposed on the pad mounting surface 10, and a metal coating 12 plated on each of the bonding pad 11.

Figure 2:
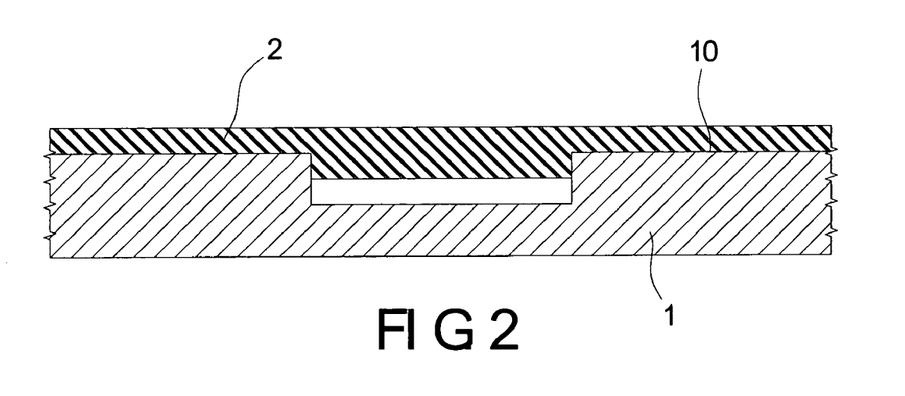

Thereafter, a whole area of the pad mounting surface 10 is covered with an insulative layer 2, as shown in FIG. 2. According to this embodiment, the insulative layer 2 is formed from a photoresist.

Figure 3:
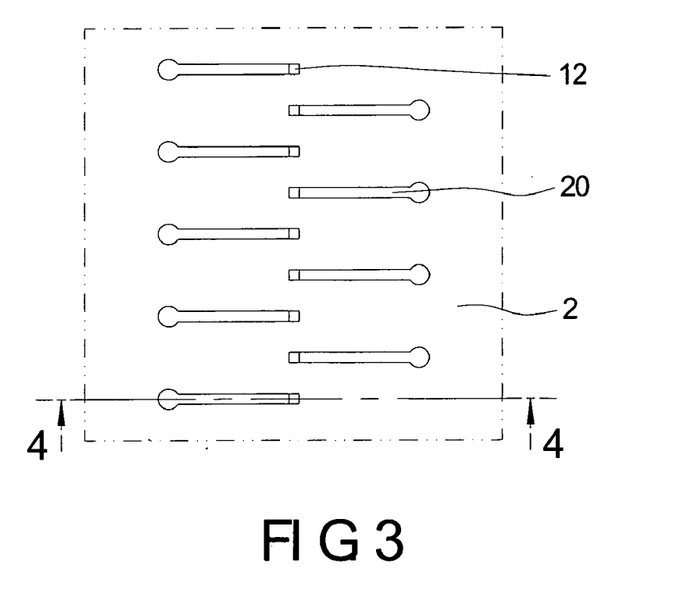
Figure 4:
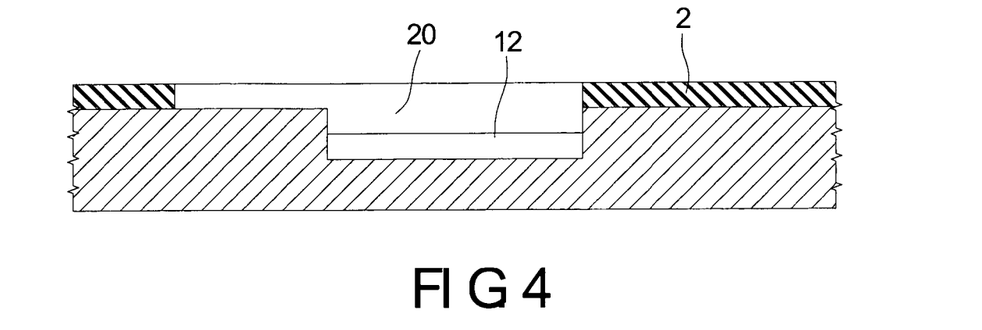

Referring to FIGS. 3 and 4, where FIG. 4 is a cross-sectional view taken along line 4—4 of FIG. 3. After formation of the insulative layer 2, photo masking and chemical rinsing processes are employed to form conductor formation holes 20 in the insulative layer 2 corresponding to the bonding pads 11. The conductor formation holes 20 expose at least a part of the metal coating 12 on each of the bonding pad 11s to an outside thereof. Each of the conductor formation holes 20 exposes a part of the metal coating 12 of a respective one of the bonding pads 11 and an adjacent part of the pad mounting surface 10 of the semiconductor wafer 1 to the outside, so that the respective conductor formed in the respective conductor formation holes 12 extends from the metal coating 12 of the respective one of the bonding pads 11 to a predetermined location on the pad mounting surface 10 of the semiconductor wafer 1.

According to this embodiment, each of the conductor formation holes 20 exposes a part of the metal coating 12 on a respective one of the bonding pads 11 and a part of the pad mounting surface 10 adjacent to the respective one of the bonding pads 11.

Figure 5:
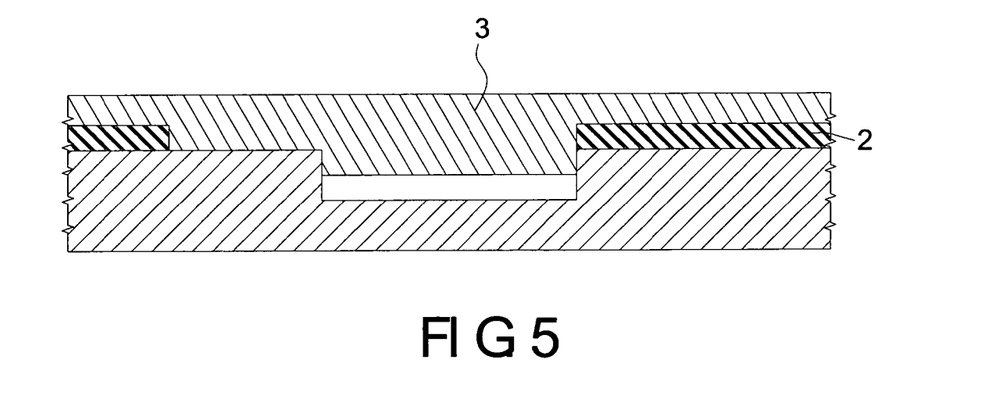

Thereafter, electric conducting pastes 3 are applied to the insulative layer 2 by printing or another suitable methods under the presence of an applied pressure or a vacuum, to fill up the conductor formation holes 20, so as to form a plurality of conductors that extend from the metal coating 12 on each of the bonding pad 11 to the pad mounting surface 10 of the wafer 1 (see FIG. 5).

Figure 6:
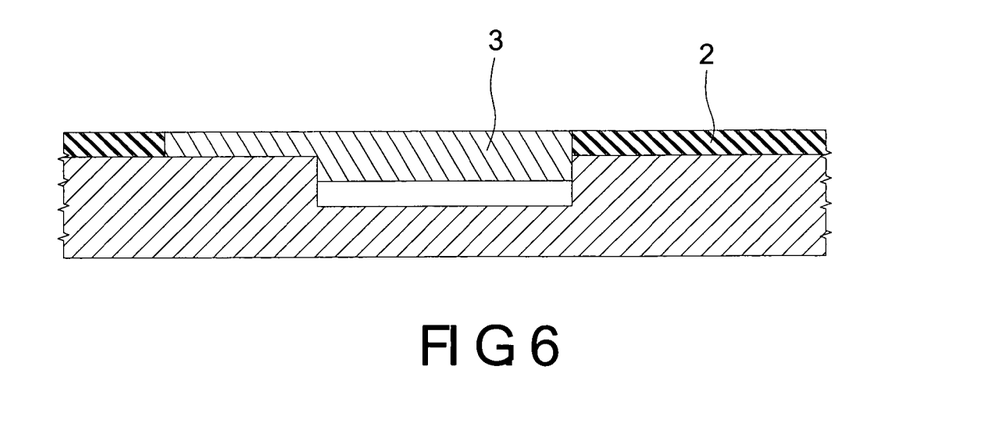

Thereafter, a grinding process is employed to remove the electric conducting pastes 3 from the insulative layer 2, and therefore the insulative layer 2 separates the conductors of the electric conducting pastes 3 in the conductor formation holes 20 from one another.

Figure 7:
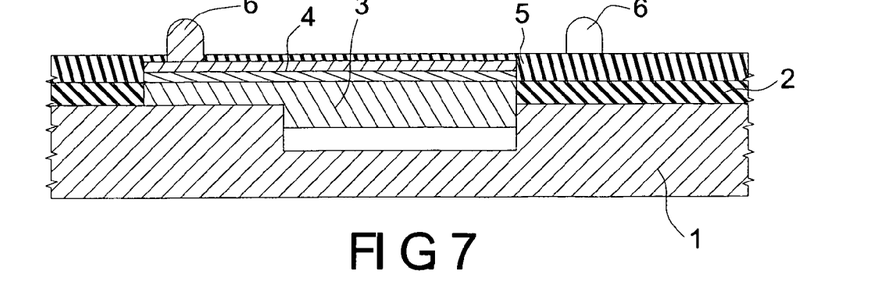
Figure 8:
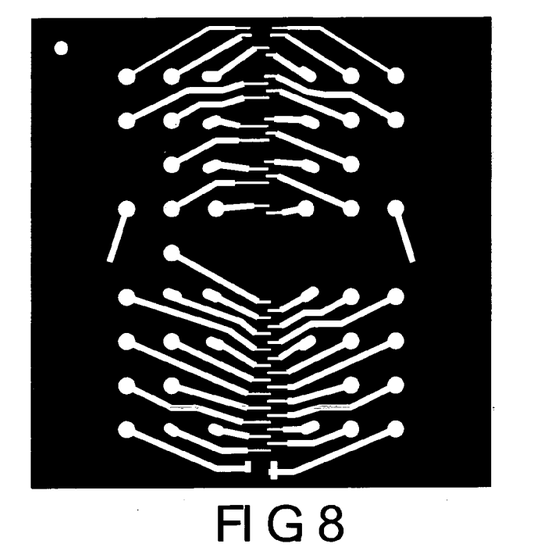

Reference is made to FIGS. 7 and 8, where FIG. 8 is a top view of a part of one die zone of the wafer 1. After the aforesaid grinding process, the electric conducting pastes 3 in each of the conductor formation holes 20 is plated with a nickel layer and a gold layer, thereby forming a conducting layer 4 on each of the conductors. Thereafter, a photoresist protective layer 5 is formed on the insulative layer 2 and covering the conducting layers 4. Photo masking and chemical rinsing processes are then employed to the photoresist protective layer 5 to make holes in the photoresist protective layer 5 for exposing parts of the respective conducting layers 4, and then conductive bumps 6 are respectively formed in the holes in the photoresist protective layer 5 to connect electrically with the corresponding conducting layer 4 and partially protruding over the top side of the photoresist protective layer 5.

Figure 9:
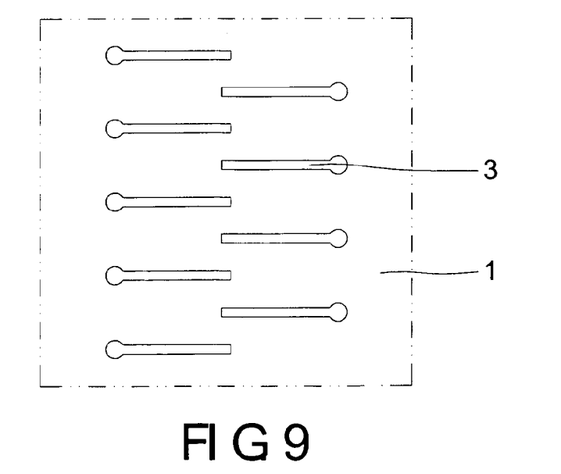
FIG. 9–11 are schematic, cross-sectional views, showing a part of the semiconductor wafer level package manufacturing flow according to the second embodiment of the present invention.
Figure 10:
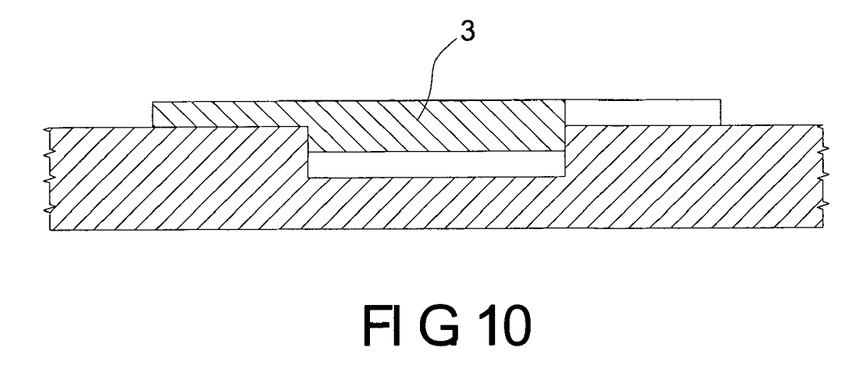
Figure 11:
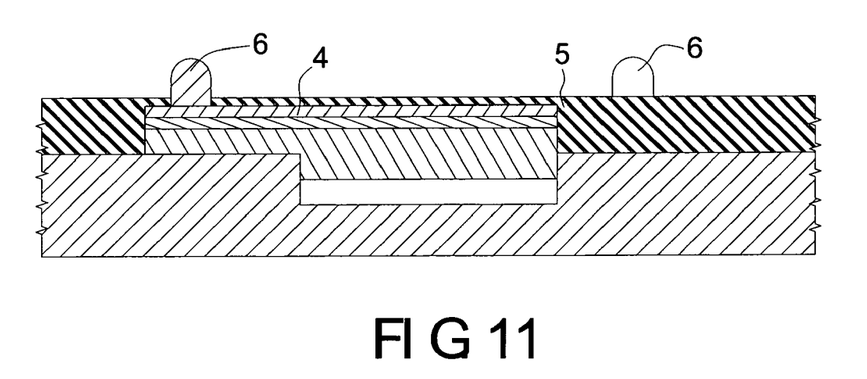

FIGS. 9–11 are schematic drawings showing a part of the manufacturing flow of the semiconductor wafer level packaging procedure according to the second embodiment of the present invention.

The manufacturing flow before FIG. 9 of this second embodiment is same as that shown in FIGS. 1–6. FIG. 10 is a cross-sectional view taken along line X—X of FIG. 9. FIGS. 9 and 10 show that the insulative layer 2 is removed after a grinding process. After grinding, the insulative layer 2 is removed.

Referring to FIG. 11, each of the electric conducting pastes 3 in the respective conductor formation holes is plated with a nickel layer and a gold layer to form a conducting layer 4. Thereafter, a photoresist protective layer 5 is formed on the pad mounting surface 10 and covering the conducting layers 4. Photo masking and chemical rinsing processes are then employed on the photoresist protective layer 5 to make holes in the photoresist protective layer 5 for exposing parts of the respective conducting layers 4, and then conductive bumps 6 are respectively formed in the holes in the photoresist protective layer 5 to connect electrically with the corresponding conducting layer 4 and partially protrude over the top side of the photoresist protective layer 5.

FIGS. 12–16 are schematic drawing showing a part of the manufacturing flow of the semiconductor wafer level packaging procedure according to the third embodiment of the present invention.

Figure 12:
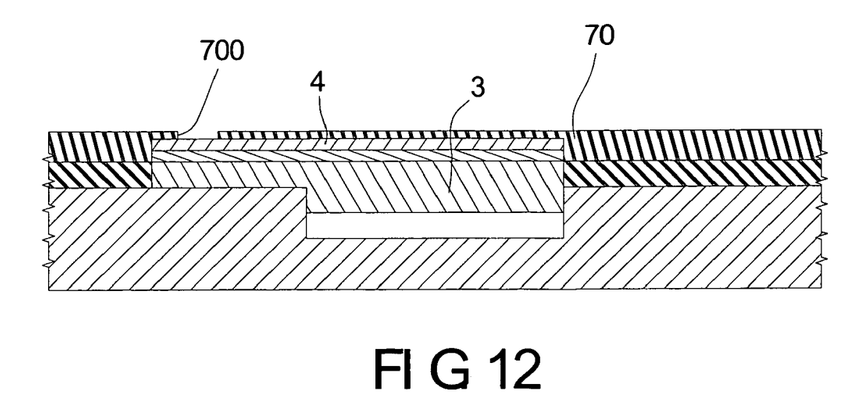
FIG. 12–16 are schematic, cross-sectional views, showing a part of the semiconductor wafer level package manufacturing flow according to the third embodiment of the present invention.

The manufacturing flow according to the third embodiment of the present invention before the step of FIG. 12 is same as that shown in FIGS. 1–6.

Referring to FIG. 12, after grinding, each of the electric conducting pastes 3 in the respective first conductor formation holes 20 is plated with a nickel layer and a gold layer, thereby a conducting layer 4 is formed on each of the conductors. Thereafter, a first cover layer 70 is formed of photoresist on the insulative layer 2 and covers the conducting layers 4. Photo masking and chemical rinsing processes are then employed on the first cover layer 70 to make second conductor formation holes 700 in the first cover layer 70 for exposing parts of the respective conducting layers 4.

Figure 13:
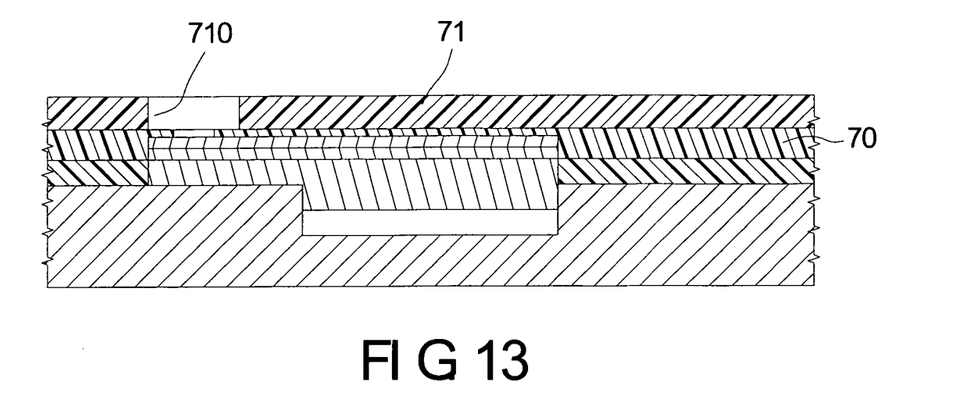

Thereafter, as shown in FIG. 13, a photoresist is employed to form a second cover layer 71 on the first cover layer 70. Photo masking and chemical rinsing processes are then employed on the second cover layer 71 to make third conductor formation holes 710 in the second cover layer 71 corresponding to the second conductor formation holes 700 in the first cover layer 70, where the third conductor formation holes 710 are respectively axially aligned with the second conductor formation holes 700, and each of the third conductor formation holes 710 has a diameter relatively greater than that of each of the second conductor formation holes 700.

Figure 14:
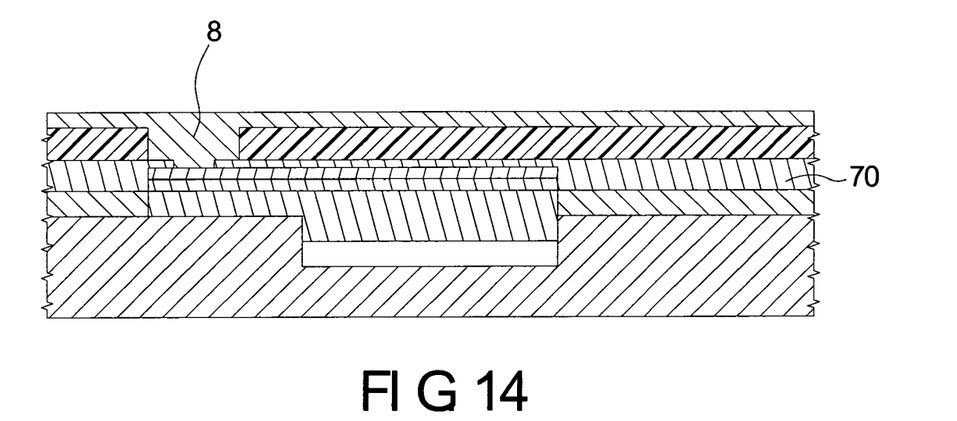

Thereafter, the second cover layer 71 is covered with a layer of electric conducting pastes 8 and the second conductor formation holes 700 and the third conductor formation holes 710 are filled therewith. As shown in FIG. 14, the electric conducting pastes 8 in the second conductor formation holes 700 are electrically connected to the corresponding conducting layer 4.

Figure 15:
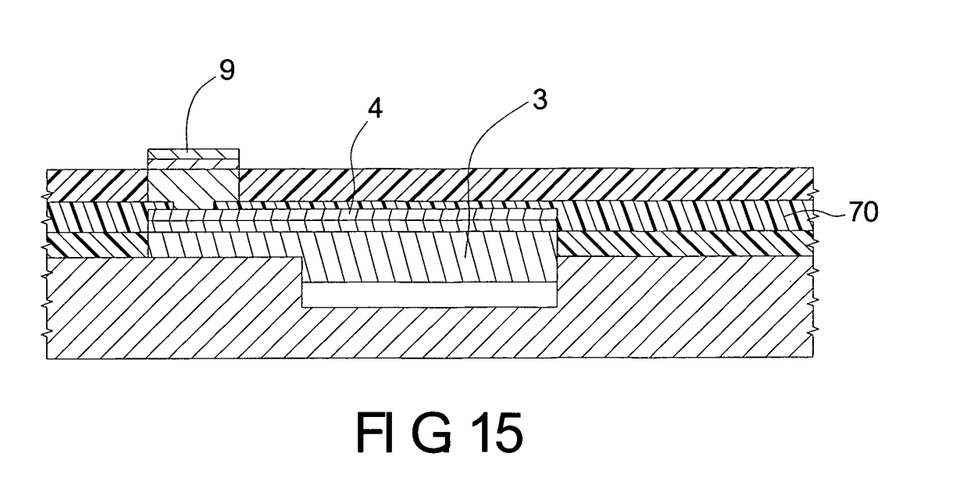

Thereafter, a grinding process is employed to remove the layer of electric conducting pastes 8 from the second cover layer 71, as shown in FIG. 15, and then each of the electric conducting pastes 8 in the respective third conductor formation holes 710 is plated with a nickel layer and a gold layer, thereby a conducting layer 9 is formed on each of the conductors.

Figure 16:
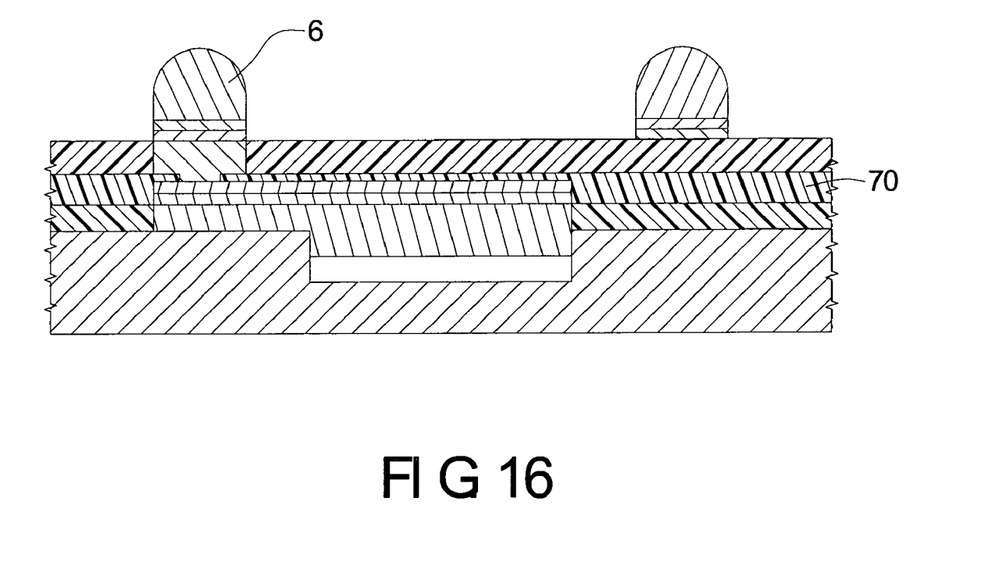

Thereafter, as shown in FIG. 16, a conductive bump 6 is formed on the conducting layer 9.

As indicated above, the invention does not use any steel plating, thereby eliminating the problems encountered in the application of the prior art techniques, i.e., the invention eliminates the problem of being not able to form conductors with electric conducting pastes due to a narrow pitch between each of the two adjacent bonding pads at the wafer. By means of the application of the present invention, the width of the conductors can range from 1 mm to 25 mm. Further, by means of the application of the third embodiment of the present invention, the conductive bumps can be made relatively bigger for easy connection of external circuits. Employment of the surface mounting technique to make a wafer level package according to the present invention prevents cracking of the semiconductor wafer level package under pressure, by means of the cover layer.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A wafer level package, comprising:
    a semiconductor wafer, said semiconductor wafer comprising a plurality of die zones, a pad mounting surface, and at least one bonding pad disposed on said pad mounting surface;
    an insulative layer formed over said pad mounting surface, said insulative layer having at least one first conductor formation hole defined therein, said at least one bonding pad and a portion of said pad mounting surface connected and adjacent to said at least one bonding pad being exposed through said at least one first conductor formation hole;
    at least one conductor formed from an electric conducting paste filling said at least one first conductor formation hole and covering said at least one bonding pad and said portion of said pad mounting surface of said wafer;

at least one conducting layer positioned on said at least one conductor in contact therewith, an interface formed between a surface of said at least one conducting layer and said at least one conductor extending substantially over the entire said surface of said at least one conducting layer;

a first cover layer covering said insulative layer, said first cover layer having defined therein at least one second conductor formation hole for exposing a portion of said at least one conducting layer;

a second cover layer covering said first cover layer, said second cover layer having defined therein at least one third conductor formation hole axially aligned with said at least one second conductor formation hole defined in said first cover layer, said at least one third conductor formation hole having a diameter thereof greater than that of said at least one second conductor formation hole;

electric conducting pastes filling said at least one third conductor formation hole and said at least one second conductor formation hole, thus forming an electric connection to said at least one conducting layer; and at least one conductive bump disposed on said electric conducting pastes in said at least one third conductor formation hole.

2. The wafer level package as claimed in claim 1, wherein said at least one conducting layer is formed of a nickel layer and a gold layer.

3. The wafer level package as claimed in claim 1 further comprising
a metal plating layer formed on said electric conducting pastes in said third conductor formation holes.

4. The wafer level package as claimed in claim 3, wherein said plating layer is formed of a nickel layer and a gold layer.

5. The wafer level package as claimed in claim 1, further comprising a metal coating plated on said at least one bonding pad.

6. A wafer level package, comprising:
a semiconductor wafer, said semiconductor wafer comprising a plurality of die zones, a pad mounting surface, and at least one bonding pad disposed on said pad mounting surface;

an insulative layer formed over said pad mounting surface, said insulative layer having at least one conductor formation hole defined therein and exposing said at least one bonding pad and a portion of said pad mounting surface adjacent to and in contact with said at least one bonding pad;

at least one conductor formed from an electric conducting paste filling said at least one conductor formation hole and covering said portion of said pad mounting surface of said wafer;

at least one conducting layer positioned on said at least one conductor in contact therewith, an interface formed between a surface of said at least one conducting layer and said at least one conductor extending substantially over the entire said surface of said conducting layer;

a protective layer formed on said insulative layer, said protective layer having defined therein at least one hole for exposing parts of said at least one conducting layer; and at least one conductive bump disposed on said at least one conducting layer and partially protruding over said protective layer.

7. The wafer level package as claimed in claim 6, wherein said conducting layer is formed of a nickel layer and a gold layer.

8. The wafer level package as claimed in claim 6, further comprising a metal coating plated on said at least one bonding pad.

9. A wafer level package, comprising:
a semiconductor wafer, said semiconductor wafer comprising a plurality of die zones, a pad mounting surface, and at least one bonding pad disposed on said pad mounting surface; at least one conductor formed of electric conducting pastes on said at least one bonding pad and extending beyond said at least one bonding pad to cover said pad mounting surface of said wafer;

at least one conducting layer positioned on said at least one conductor in contact therewith, an interface formed between a surface of said at least one conducting layer and said at least one conductor extending substantially over the entire said surface of said at least one conducting layer;

a protective layer formed on said pad mounting surface, said protective layer having defined therein at least one hole for exposing parts of said at least one conducting layer; and at least one conductive bump formed in said at least one hole of said protective layer, said at least one conductive bump being connected electrically to said at least one conducting layer and partially protruding over said protective layer.

10. The wafer level package as claimed in claim 9, wherein said at least one conducting layer is formed of a nickel layer and a gold layer.

11. The wafer level packaging procedure as claimed in claim 9, further comprising a metal coating plated on said at least one bonding pad.

* * * * *